(12) United States Patent
Holmes et al.

(10) Patent No.: US 12,732,277 B2
(45) Date of Patent: Sep. 8, 2026

(54) POLYCHROMIC MICROLED EMITTERS FOR DATA COMMUNICATIONS

(71) Applicant: Lumileds LLC, San Jose, CA (US)

(72) Inventors: Mark James Holmes, San Jose, CA (US); Brendan Jude Moran, San Jose, CA (US); Johannes Willem Herman Sillevis Smitt, San Jose, CA (US); Luke Gordon, Sunnyvale, CA (US); Yu-Chen Shen, Sunnyvale, CA (US)

(73) Assignee: Lumileds LLC, San Jose, CA (US)

( * ) Notice: Subject to any disclaimer, the term of this patent is extended or adjusted under 35 U.S.C. 154(b) by 277 days.

(21) Appl. No.: 18/437,448

(22) Filed: Feb. 9, 2024

(65) Prior Publication Data

US 2025/0260492 A1 Aug. 14, 2025

(51) Int. Cl.
*H04B 10/43* (2013.01)
*H05B 45/325* (2020.01)
*H10W 90/00* (2026.01)

(52) U.S. Cl.
CPC .......... *H04B 10/43* (2013.01); *H05B 45/325* (2020.01); *H10W 90/00* (2026.01)

(58) Field of Classification Search
CPC ....... H01L 25/16; H04B 10/43; H05B 45/325; H05B 1/02; H05B 3/02; H05B 3/10; H05B 3/20; H05B 3/40; H05B 3/62; H05B 3/68; H05B 3/78; H05B 3/84; H05B 6/02; H05B 6/46; H05B 6/64; H05B 7/02; H05B 7/18; H05B 31/02; H05B 31/36; H05B 31/40;
(Continued)

(56) References Cited

U.S. PATENT DOCUMENTS 5,412,592 A * 5/1995 Krishnamoorthy .. G11C 13/042
7,547,115 B2 * 6/2009 Chou ........................ F21K 9/00
362/555

(Continued)

FOREIGN PATENT DOCUMENTS

WO WO-2018236947 A2 * 12/2018 ......... G02B 27/0172

OTHER PUBLICATIONS

Dingbo Chen et al. , "Integration Technology of Micro-LED for Next-Generation Display," Apr. 12, 2023, Research 2023, vol. 6, Article ID: 0047, https://doi.org/10.34133/research, pp. 1-20.*

(Continued)

*Primary Examiner* — Omar S Ismail
(74) *Attorney, Agent, or Firm* — Schwegman, Lundberg & Woessner, P.A.

(57) ABSTRACT

A microlight emitting diode (LED) system and method of transmitting data are disclosed. The system includes either a first array that contains multiple subarrays or a second array. Each subarray includes multiple independently-addressable single color microLEDs that emit light of different colors and are independently modulated for data communication to another microLED array. The second array contains at least one independently-addressable polychromic microLED. Each polychromic microLED has multiple independently-addressable active regions that emit different colors and that are independently modulated for data transmission to the other microLED array. A photodetector array receives data as multi-color light from the other microLED array and has multiple photodetectors each tuned for a specific color.

20 Claims, 8 Drawing Sheets

(58) Field of Classification Search

CPC ........ H05B 31/44; H05B 31/48; H05B 33/02; H05B 33/12; H05B 39/04; H05B 41/02; H05B 41/14; H05B 45/10; H05B 45/20; H05B 45/30; H05B 45/40; H05B 45/50; H05B 47/10; H05B 47/20; H05B 41/04; H05B 41/06; H05B 41/16; H05B 41/26; H05B 41/30; H05B 41/36

See application file for complete search history.

(56) References Cited

U.S. PATENT DOCUMENTS 7,972,885 B1* 7/2011 Dutta .................... H10F 77/147 257/E21.189
8,692,344 B2* 4/2014 Oganesian ............. H04N 25/76 257/431
9,653,642 B1* 5/2017 Raring ................. H10D 62/824
12,367,846 B1* 7/2025 Juhola .................... G09G 3/003
2003/0142196 A1* 7/2003 Yasuda .................... B41J 2/451 347/241
2004/0252867 A1* 12/2004 Lan .................... G06V 40/1318 382/124
2006/0044523 A1* 3/2006 Teijido ............... G02B 19/0028 348/E9.027
2006/0238723 A1* 10/2006 El-Ghoroury ........ H04N 9/3147 348/E9.027
2008/0224025 A1* 9/2008 Lyons ....................... G01J 1/32 250/205
2010/0002115 A1* 1/2010 Liu ........................ H04N 25/41 348/308
2010/0259917 A1* 10/2010 Ramer ...................... F21K 9/62 362/84
2010/0284201 A1* 11/2010 Alasaarela ......... G02B 27/0994 362/551
2014/0267850 A1* 9/2014 Li ......................... H10F 39/182 348/294
2014/0361782 A1* 12/2014 Kurosawa ............ G01N 21/956 324/501
2017/0018215 A1* 1/2017 Black ................. G02B 26/0883
2017/0059841 A1* 3/2017 Trulson .............. G02B 27/0037
2018/0198980 A1* 7/2018 Takagi ................... G06V 40/19
2018/0284460 A1* 10/2018 Cheng ................ G02B 27/1046
2019/0371647 A1* 12/2019 Ahn ........................ H10P 72/78
2020/0013648 A1* 1/2020 Ahn .................... H10P 72/0446
2020/0035146 A1* 1/2020 Pan ....................... H01S 5/0218
2020/0043771 A1* 2/2020 Ahn .................... H10P 72/0446
2020/0049979 A1* 2/2020 Brennan .............. G02B 6/0016
2020/0111259 A1* 4/2020 Sears ................. G02B 27/0172
2020/0251373 A1* 8/2020 Ahn .................... H10P 72/0446
2020/0287110 A1* 9/2020 Oh ........................ H10H 20/857
2020/0303586 A1* 9/2020 Ahmed ................ H10H 20/812
2020/0313057 A1* 10/2020 Daeschner ........... H10H 20/856
2021/0043797 A1* 2/2021 Ahn ........................ H10H 20/01
2021/0050236 A1* 2/2021 Ahn ........................ B65G 47/91
2021/0063816 A1* 3/2021 He .................... G02F 1/133615
2021/0111148 A1* 4/2021 Chen ................... H10P 72/0442
2021/0140763 A1* 5/2021 Pesach ................. A61B 5/0088
2021/0151649 A1* 5/2021 Goward ............... H10H 20/857
2021/0201769 A1* 7/2021 Morris ...................... G09G 3/32
2022/0005404 A1* 1/2022 Petluri ..................... G09G 3/32
2022/0036793 A1* 2/2022 Petluri ................... H05B 47/17
2022/0180803 A1* 6/2022 Petluri ................. G09G 3/3413
2022/0293574 A1* 9/2022 Liu ....................... H10W 90/00
2023/0058551 A1* 2/2023 Chen .................. H10H 20/8514
2023/0090281 A1* 3/2023 Kurtz ..................... G02B 13/06 359/725
2023/0163108 A1* 5/2023 Lo ......................... H01L 25/167 257/79
2023/0236453 A1* 7/2023 Zha ................... G02F 1/133516 349/42
2025/0219032 A1* 7/2025 Duong .................. H10W 90/00
2025/0221800 A1* 7/2025 Kjær .................... H04N 13/246
2026/0003146 A1* 1/2026 Kim ......................... G02B 6/43

OTHER PUBLICATIONS

Tingwei Lu et al. ,"High-speed visible light communication based on micro-LED: A technology with wide applications in next generation communication," Dec. 29, 2022, , Opto-Electronic Science, 2022, vol. 1, No. 12, pp. 220020-1-220020-18.*

Chang-Mo Kang et al., "Fabrication of a vertically-stacked passivematrix micro-LED array structure for a dual color display," Jan. 31, 2017, Optics Express 2489, vol. 25, No. 3, Feb. 6, 2017, pp. 1-6.*

Yoshinobu Matsuda et al., "Flexible topographical design of light-emitting diodes realizing electrically controllable multi-wavelength spectra," Aug. 4, 2023, Scientific Reports, 13, Article No. 12665 (2023), pp. 1-8.*

Yifan Wu et al., "Full-Color Realization of Micro-LED Displays," Dec. 10, 2020, Nanomaterials 2020, 10, 2482, pp. 1-21.*

Mohamed Elsherif et al., "Optical Fiber Sensors: Working Principle, Applications, and Limitations," Jul. 13, 2022,Advanced Photonics Research, vol. 3, Issue 11, Nov. 2022, pp. 1-16.*

Konthoujam James Singh et al., "Micro-LED as a Promising Candidate for High-Speed Visible Light Communication," Oct. 20, 2020, Applied Sciences, vol. 10, Issue 20, pp. 1-25.*

V. Kumar et al., " MicroLED/LED electro-optical integration techniques for non-display applications," May 1, 2023, Applied Physics Reviews, 10, 021306 (2023), pp. 021306-1-021306-14.*

Jhih-Min Wun et al., "GaN-Based Miniaturized Cyan Light-Emitting iodes on a Patterned Sapphire Substrate With Improved Fiber Coupling for Very High-Speed Plastic Optical Fiber Communication," Jul. 31, 2012, IEEE Photonics Journal ( vol. 4, Issue: 5, Oct. 2012), pp. 1520-1526.*

* cited by examiner 600
602
604
606
608
$T_c$(K)
10000
6000
4000
3000
2500
2000
1500
∞
520
540
560
580
600
620
700
500
490
480
470
460
380
x
y
0.0
0.1
0.2
0.3
0.4
0.5
0.6
0.7
0.8
0.9

Alphanumeric Input Device 712
UI Navigation Device 714
Storage Device 716
Machine-Readable Medium 722
Software 724
Signal Generation Device 718
Camera 728
Sensors 730
Link
708
Processor 702
Software 724
Memory 704
Software 724
Light source 710
Network Interface Device 720
Transmission Medium 726
700

POLYCHROMIC MICROLED EMITTERS FOR DATA COMMUNICATIONS

BACKGROUND OF THE DISCLOSURE

Light-emitting diodes (LEDs) provide an efficient and relatively smaller source of light compared to conventional light sources. The use of LEDs has evolved from systems that provide purely ambient lighting to more complicated systems, for example those incorporated in portable devices. Due at least in part to wide variety of LED applications, there is ongoing effort to improve LED technology, applications that use LEDs, as well as develop new LED uses.

BRIEF DESCRIPTION OF THE DRAWINGS

Corresponding reference characters indicate corresponding parts throughout the several views. Elements in the drawings are not necessarily drawn to scale. The configurations shown in the drawings are merely examples and should not be construed as limiting in any manner.

DETAILED DESCRIPTION

Figure 1:
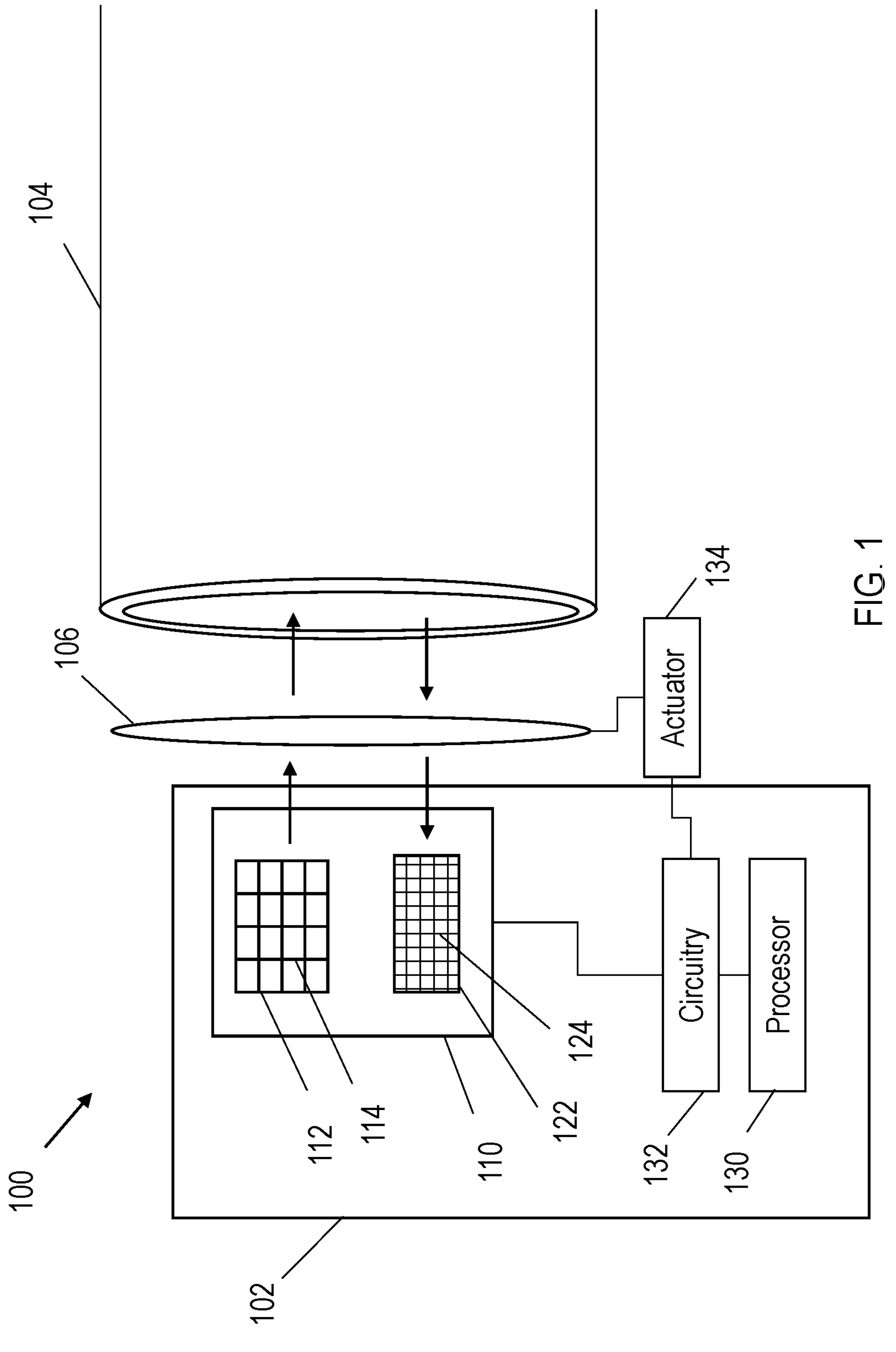
FIG. 1 shows a system in accordance with some examples.

The use of the LEDs in electronic devices has increased rapidly as the number and types of devices have expanded in various ways. Beyond mere displays, for example, compact light sources have recently been incorporated in augmented reality (AR) and virtual reality (VR) devices, among others. Such devices may be enabled by arrays of LEDs, and in some cases, specifically microLED arrays.

A microLED array may contain thousands to millions of microscopic microLEDs that may be individually controlled or controlled in groups of pixels (e.g., 5×5 groups of pixels). MicroLEDs are relatively small (e.g., <0.07 mm on a side) and may provide monochromic or multi-chromic light, typically red, green, blue, or yellow using inorganic semiconductor material. Other LEDs may have a size, for example, of about 4 $mm^2$, 250 micron×250 micron, or larger. Unless otherwise indicated, discussions of LEDs herein include microLEDs.

Active layers of LEDs in general may be formed from one or more inorganic materials usually either III-V materials (defined by columns of the Periodic Table) or II-VI materials. For example, LEDs may be formed using doped gallium nitride (GaN) or ternary compounds such as aluminum gallium arsenide (AlGaAs), indium gallium nitride (InGaN), or indium gallium phosphide (InGaP) or quaternary compounds such as indium gallium arsenide phosphide (InGaAsP).

LEDs may emit light in the visible spectrum (about 400 nm to about 800 nm) and/or may emit light in the infrared spectrum (above about 800 nm). LEDs may be formed by epitaxially growing active, n- and p-type semiconductors on a rigid substrate (which may be textured). The substrate may include, for example, sapphire aluminum oxide ($Al_2O_3$) or silicon carbide (SiC), among others. In particular, various layers are deposited and processed on the substrate during fabrication of the LEDs to form a LED array. The surface of the substrate may be pretreated to anneal, etch, polish, etc. the surface prior to deposition of the various semiconductor, dielectric, and conductive layers used to form an LED structure. The original substrate may be removed and replaced by suppporting structure such as a temporary substrate or a relatively thin transparent substrate, such as glass or polyimide. In general, the various active layers may be fabricated using epitaxial semiconductor deposition to provide one or more semiconductor layers, metal deposition (e.g., by sputtering), oxide growth, as well as etching, liftoff, and cleaning, among other operations.

In some aspects, the substrate (original or temporary) may be removed from the LED structure after fabrication and after connection to contacts on a backplane via metal bonding such as wire or ball bonding. The backplane may be a printed circuit board or wafer containing integrated circuits (ICs), such as a complementary metal oxide semiconductor (CMOS) IC wafer.

The semiconductor deposition operations may be used to create an active region of the LED in which electron-hole recombination occurs and the light from the LED is generated. The active region may be, for example, one or more quantum wells. Metal contacts may be used to drive provide current to the n- and p-type semiconductors from the ICs of the backplane on which the LED array is disposed. Methods of depositing materials, layers, and thin films may include, for example: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof, among others.

In some aspects, one or more other layers, such as a phosphor-converting layer that contains phosphor particles, may be disposed on some or all of the LEDs or across the LED array to convert at least a portion of the light from the LEDs to light of a different wavelength. For example, blue light may be converted into near infrared light or white light by the phosphor-converting layer. In other embodiments, one or more optics such as lenses or reflectors (at the wavelength emitted by the active region) may be disposed on some or all of the LEDs or across the LED array to adjust the light from the LEDs.

As above, LEDs have been used in a variety of applications. One application into which LEDs have made limited inroads is optical communications. Typically, lasers have been used in optical communcations for a variety of reasons that include available power and narrow wavelength, allowing a longer range of communications to be used with limited signal regeneration (i.e., booster) stations, if used. The use of LEDs, however, may offer a variety of benefits, especially in short range communications such as board-to-board (e.g., PCB-PCB) communications or local (e.g., within a few feet) server-to-server communications.

FIG. 1 shows a system 100 in accordance with some examples. The system 100 include a device 102 that contains a CMOS backplane 110 on which one or more light sources 112 and one or more light receivers 122 are disposed.

The light source 112 may include one or more segmented LED arrays, each with multiple LEDs 114. The light receiver 114 may similarly include one or more segmented photodetector arrays, each with multiple photodetectors 124. Each of the LEDs 114 may produce visible and/or near infrared light, whose wavelength may be detected by one or more corresponding photodetectors 124. The LEDs 114 may be microLEDs in some embodiments. Each LED 114 or set of LEDs (e.g., red, green, blue LED) may form a pixel of the corresponding LED array. The light source 112 may also include one or more lasers that emit light, with light emitted by the lasers having the same or different wavelengths.

LEDs 114 in a particular LED array that emit light in the infrared spectrum may be, for example, interspersed with LEDs 114 that emit light in the visible spectrum, or each type of LED (visible emitter/infrared emitter) may be disposed on different sections of the particular LED array. Alternatively, each LED array may only emit light in either the visible spectrum or the infrared spectrum; separate (one or more) LED arrays may be used to emit light in the infrared spectrum. Each of the individual LED arrays, LEDs 114 within each LED array, and/or groups of LEDs 114 within each LED array 114 (e.g., sets of 3×3 LEDs) may be individually controllable by the processor 130.

Similarly, the photodetectors 124 in a particular photodetector array may be tuned (and/or the light filtered) to generate a signal based on light in a specific wavelength range. For example, photodetectors that respond to light in the infrared spectrum may be, for example, interspersed with photodetectors that respond to light in the visible spectrum, or each type of photodetector (visible/infrared) may be disposed on different sections of the particular photodetector array. Alternatively, each photodetector array may only be configured to receive light in either the visible spectrum or the infrared spectrum; separate (one or more) photodetector arrays may be used to receive light in the infrared spectrum.

LEDs 114 and photodetectors 124 may be driven using circuitry 132 that includes one or more drivers under control of one or more processors 130. The processor 130 may independently control driving of individual LEDs 114, sets of LEDs 114 in each LED array, and/or LED arrays using the circuitry 132.

The system 100 may further include one or more optical elements 106 such as one or more lenses or reflectors to concentrate and couple light from the light source 112 into an optical fiber 104. The optical fiber 104 may contain a core, through which light travels, and cladding to protect the core as well as in some cases provide an index of refraction sufficiently different from that of the core to enable the light traversing the core that impinges on the cladding to be substantially reflected back into the core, as well as a coating to protect the core and cladding. The core of the optical fiber 104 may be substantially larger than the light source 112 and light receiver 122 as shown in FIG. 1. For example, the size of a typical microLED is between about 1 micron and 10 microns, while the diameter of the core of the optical fiber 104 may be on the order of a couple of mm (i.e., about 1000× the size of the microLED).

In some embodiments, the processor 130 may control the circuitry 132 to adjust the position of the optical element 106 in one or more directions to optimize coupling of light from a set of the LEDs 114 into the optical fiber 104 and/or from the optical fiber 104 to a set of the photodetectors 124. A shutter (not shown) may be disposed in an opening of a housing of the device 102. The shutter may also be controlled by the processor 130 via the circuitry 132.

Alternatively, the optical fiber 104 may be physically coupled to the device 102 through an optical coupler such that the relative position of the optical fiber 104 is fixed with respect to the light source 112 and light receiver 122.

In some embodiments, the driving of the LEDs 114 may be controlled to provide digital information. The LEDs 114 may be driven using a direct current (DC) driver or pulse width modulation (PWM) in the circuitry 132. The LEDs 114 may be driven using a PWM whose phase shift varies between LEDs 114 to reduce potential current surge issues. The circuitry 132 may include, for example, analog-to-digital (A/D) converters and digital-to-analog (D/A) converters to convert analog signals to digital signals used to control driving of the LEDs 114 and convert digital signals received by the photodetectors 124 to analog signals, as well as filters to filter out noise in the received signal, as well as bandpass filters to filter out light of undesired wavelengths at different photodetectors 124.

As above, due to the decreased available power as well as the relatively broad wavelength compared to lasers, optical communications using LEDs is typically limited to shorter distances than laser-based optical communications. In particular, arrays of individually addressable microLEDs are promising candidates for application to high-speed data communications over short distances. The small size and high electrical efficiency of microLEDs allow for favorable properties such as fast modulation speeds (on the order of 1 GHZ) and high brightness to complete the optical link.

Figure 2:
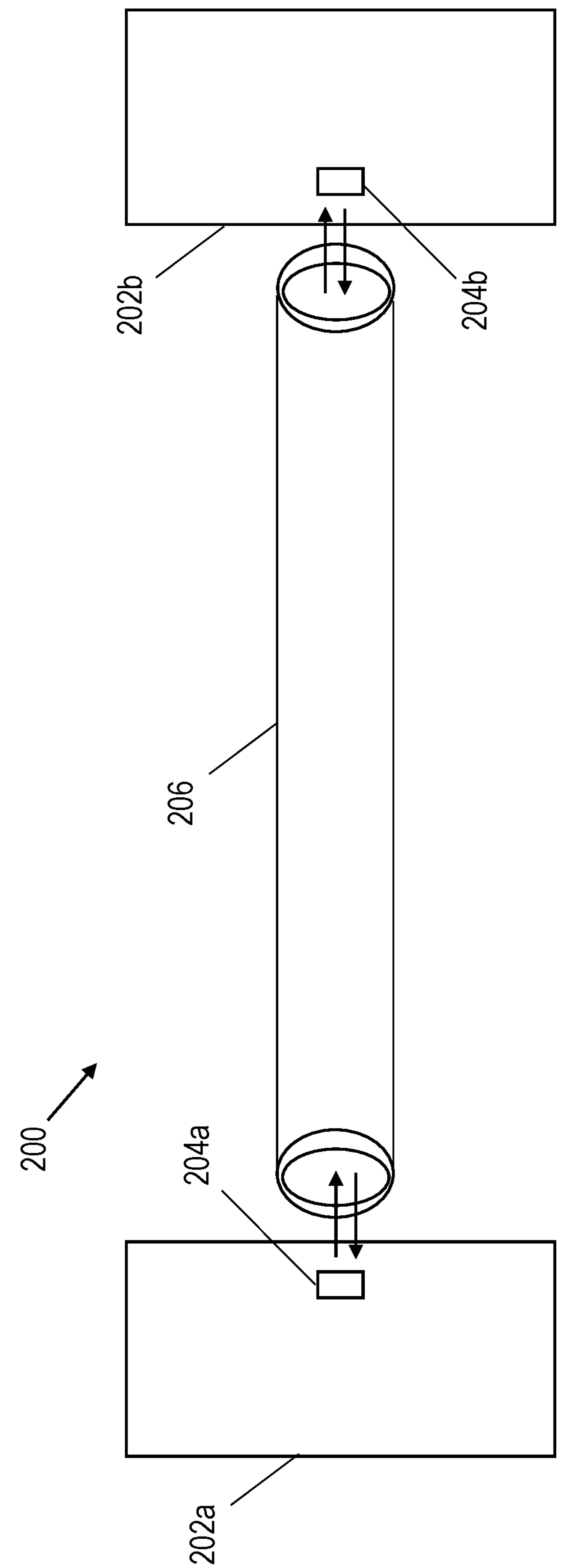
FIG. 2 shows a connection between devices in accordance with some examples.

One such connection is shown in the system 200 shown in FIG. 2, in which devices 202*a*, 202*b* communicate over a relatively short distance (i.e., up to about 100 m) using one or more optical fibers 206 in an optical fiber bundle. Such devices 202*a*, 202*b* may be servers in a data center, used within an automobile, or used in other environments in which high speed (and bandwidth) communications and/or enhanced security is desired (due to transmission using only light). Each of the devices 202*a*, 202*b* has a light emitter/receiver combination 204*a*, 204*b* through which the devices 202*a*, 202*b* communicate over the optical fiber 206. As above, in some embodiments each of the light emitter/receiver combination 204*a*, 204*b* may include microLEDs as described herein as the light emitters and photodetectors (e.g., reverse-biased PN junctions) as the light receivers. Optical elements (as above lenses and/or reflectors for example) may be present in some embodiments, allowing improved coupling between the light emitter/receiver combination 204*a*, 204*b* and the optical fiber 206. In other embodiments, optical elements may not be used, in which case, the distance in which high-speed data communications may be reduced to about 10 m or under due to the rapid decrease in power with distance from the light emitter.

Figure 3:
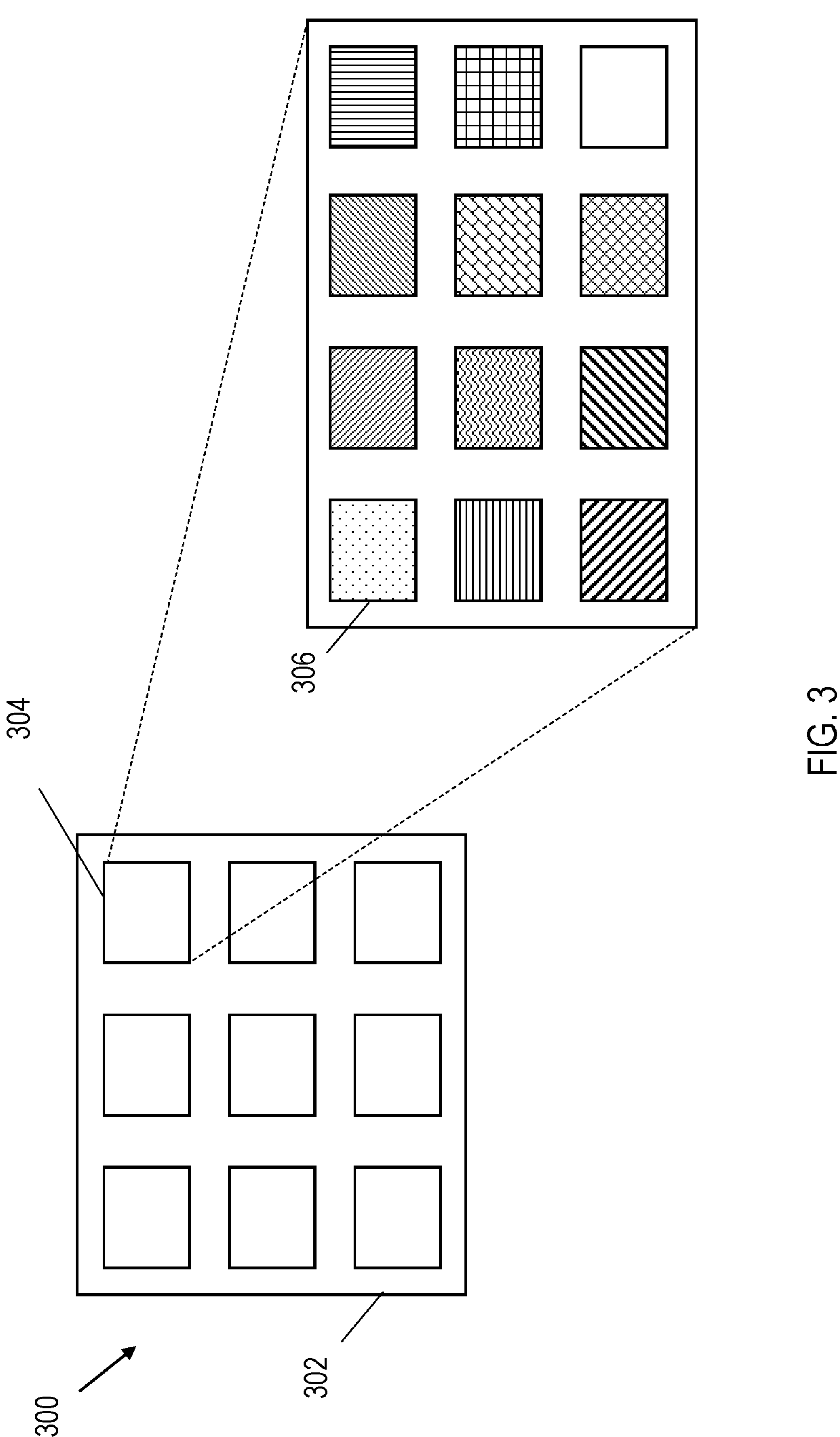
FIG. 3 illustrates a microLED array containing multiple subarrays, in accordance with some examples.
Figures 4A, 4B:
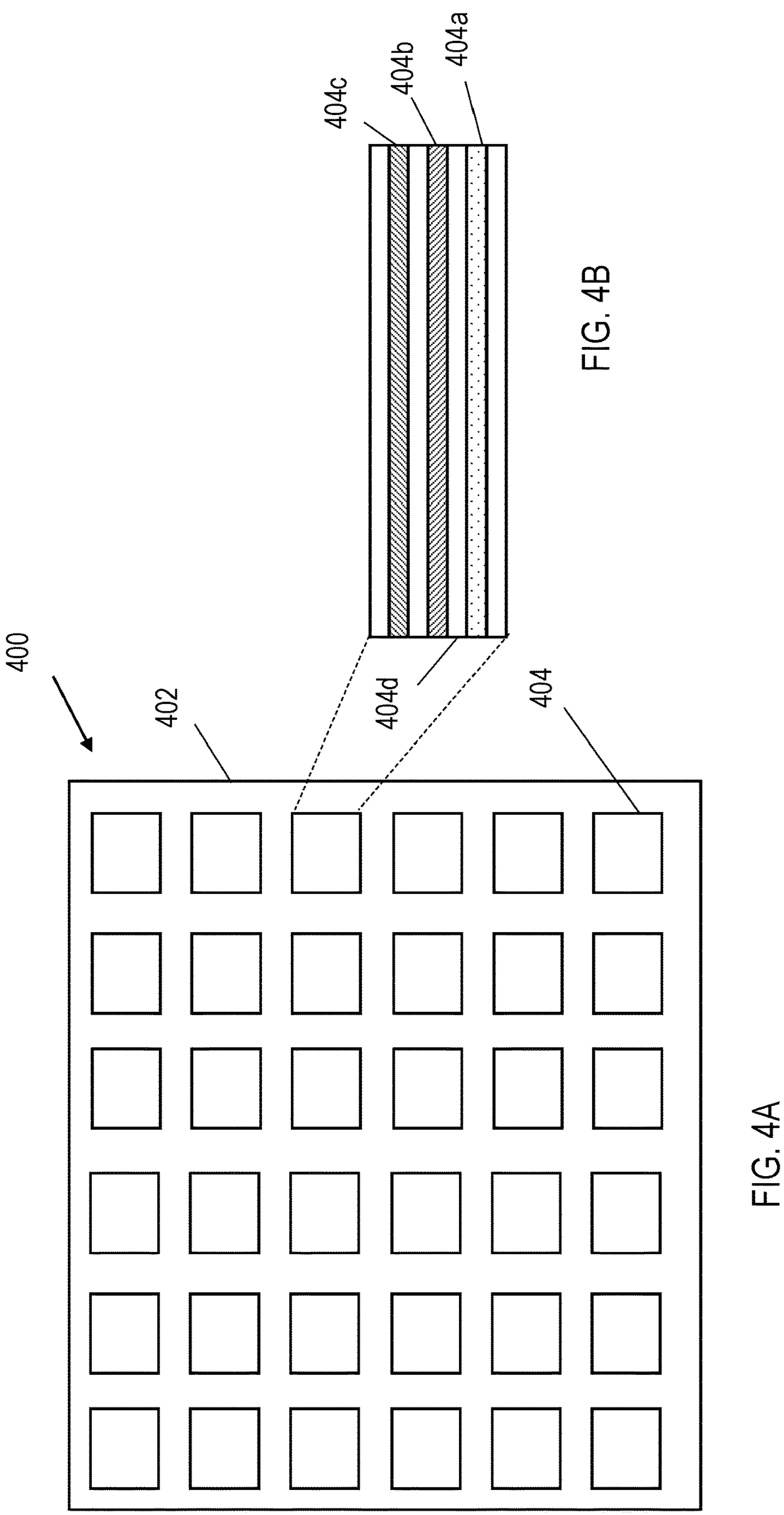
FIG. 4A illustrates a top view of microLED array containing polychromic pixels, in accordance with some examples.
FIG. 4B illustrates a cross-sectional view of one of the microLEDs of FIG. 4A in accordance with some examples.

FIG. 3 illustrates a microLED array containing multiple subarrays, in accordance with some examples. FIG. 4A illustrates a top view of microLED array containing polychromic pixels, in accordance with some examples; FIG. 4B illustrates a cross-sectional view of one of the microLEDs of FIG. 4A in accordance with some examples. The light emitter 300, 400 of FIGS. 3 and 4A and 4B may be used to provide high-speed data communications based on the use of multiple single color microLEDs 306 in FIG. 3 or polychromic microLEDs 404 in FIGS. 4A and 4B. The term "single color" is used herein to indicate a microLED that is limited to light emission having a single peak wavelength (including wavelengths in the visible and near infrared at least); the term "polychromic" is used herein to indicate a microLED that is able to emit light selected from among multiple different peak wavelengths (i.e., selectively emit light of one or more peak wavelengths among multiple peak wavelengths available, each from a different junction). Each single color microLED 306 or polychromic microLED 404 may form a microLED pixel (which may also include other conductive and insulating layers, such as contacts and side reflectors, and perhaps wavelength filters).

The use of microLEDs that emit different wavelengths may be able to increase the data transmission bandwidth through the use of correlated color temperature (CCT) and color-rendering index (CRI). In particular, the microLEDs may be driven to adjust the color temperature in addition to a relative brightness (e.g., luminous flux) of the microLEDs. The CRI is defined by the International Commission on Illumination (CIE) and provides a quantitative measure of an ability of any light source (including LEDs) to accurately represent colors in various objects in comparison with an ideal, or natural-light source. The highest possible CRI value is 100. Another metric is Du. The Du is a metric defined in, for example, CIE 1960, to represent the distance of a color point to the BBL. It is a positive value if the color point is above the BBL and a negative value if the color point is below the BBL. Color points above the BBL appear greenish in color and those below the BBL appear pinkish in color. Control of both the color temperature (CCT and $D_{uv}$) as well as a brightness level (or luminous flux) of the microLED array may permit high-speed data communications to be obtained.

In particular, driving various colors of the microLEDs including, for example, primary color (Red-Green-Blue or RGB) microLEDs or desaturated (pastel) RGB color microLEDs, may be used to obtain light of various color temperatures with a high CRI and high efficiency. Since light output of a microLED is proportional to an amount of current used to drive the microLED, dimming a microLED can be achieved by, for example, reducing the forward current transferred to the microLED. In addition to or instead of changing an amount of current used to drive each of a number of individual microLEDs, individual microLEDs may be switched between active and deactive states to achieve an appropriate level of dimming and color temperature.

Drivers may employ an analog approach in which all colors are driven simultaneously by providing an independently-controllable current for each microLED, or a PWM approach in which each color is switched on/off at high speed using identical currents. In the latter case, a particular color is controlled by changing the duty cycle of each color. For example, a first microLED that generates a first color is driven with a current for a first amount of time, a second microLED that generates a second color is driven with the same current for a second amount of time, and a third microLED that generates a third color is driven with the same current for a third amount of time. The first, second, and third amounts of time may be identical or one or more may be different. Drivers may include, for example, Metal-Oxide-Semiconductor Field Effect Transistors (MOSFETs), each having a gate to which an individual PWM signal is applied and having a source to which a constant current is supplied. While in some embodiments, each MOSFET may correspond to a different pixel, in other embodiments the output of multiple MOSFETs used to drive pixels may be logically combined to drive another pixel (i.e., more pixels than MOSFETs). In some embodiments, one or more drivers may be used for one or more rows and for one or more columns of each array, Using a desaturated RGB approach can further create tunable light on and off the BBL, as well as on the BBL, for example, an isothermal CCT line while maintaining a high CRI.

Figure 5:
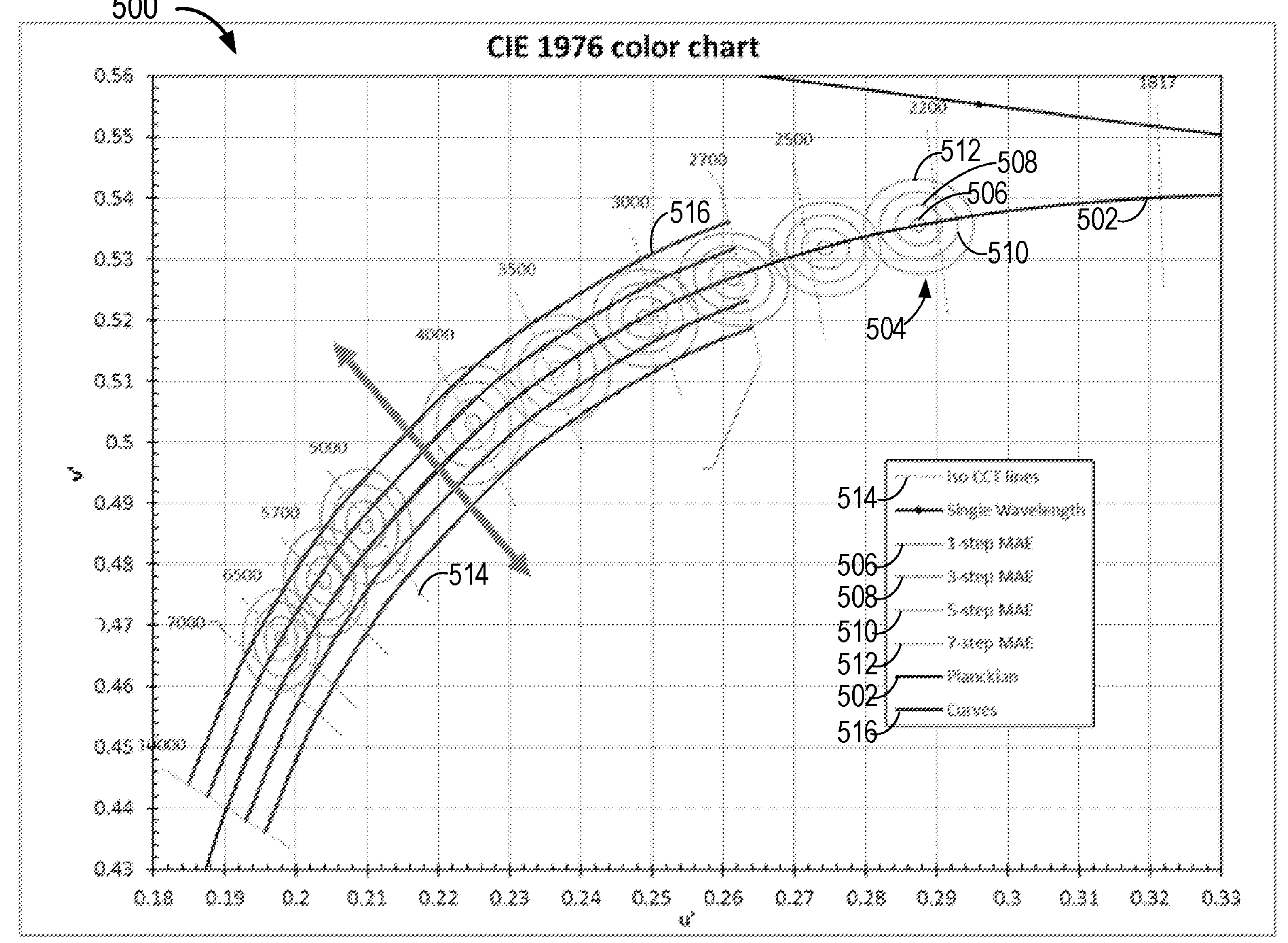
FIG. 5 shows a portion of the International Commission on Illumination (CIE) color chart.

FIG. 5 shows a portion of the CIE color chart 500, including a black body line (BBL) 502 (also referred to as a Planckian locus) that forms a basis for understanding various embodiments of the subject matter disclosed herein. The BBL 502 shows the chromaticity coordinates for blackbody radiators of varying temperatures. It is generally agreed that, in most illumination situations, light sources should have chromaticity coordinates that lie on or near the BBL 502. Various mathematical procedures known in the art are used to determine the "closest" blackbody radiator. In addition to the CCT, the chromaticity may be described by the $D_{uv}$ value, which is an indication of the degree to which a light source's chromaticity coordinate lies above the BBL 502 (a positive Dur value) or below the BBL 502 (a negative $D_{uv}$ value).

The portion of the color chart 500 is shown to include a number of isothermal lines 514. Even though each of these lines is not on the BBL 502, any color point on the isothermal line 514 has a constant CCT. For example, a first isothermal line has a CCT of 50,000 K, a second isothermal line has a CCT of 5,000 K, a third isothermal line has a CCT of 3,000 K, and a fourth isothermal line has a CCT of 2,200 K.

With continuing reference to FIG. 5, the CIE color chart 500 also shows a number of ellipses that represent a Macadam Ellipse (MAE) 504, which is centered on the BBL 502 and extends one step 506, three steps 508, five steps 510, or seven steps 512 in distance from the BBL 502. The MAE 504 is based on psychometric studies and defines a region on the CIE chromaticity diagram that contains all colors which are indistinguishable, to a typical observer, from a color at the center of the ellipse. Therefore, each of the MAE steps 506 to 512 (one step to seven steps) are seen to a typical observer as being substantially the same color as a color at the center of a respective one of the MAEs 504. A series of curves 516 represent substantially equal distances from the BBL 502 and are related to Dur values of, for example, +0.006, +0.003, 0, −0.003 and −0.006, respectively.

Figure 6:
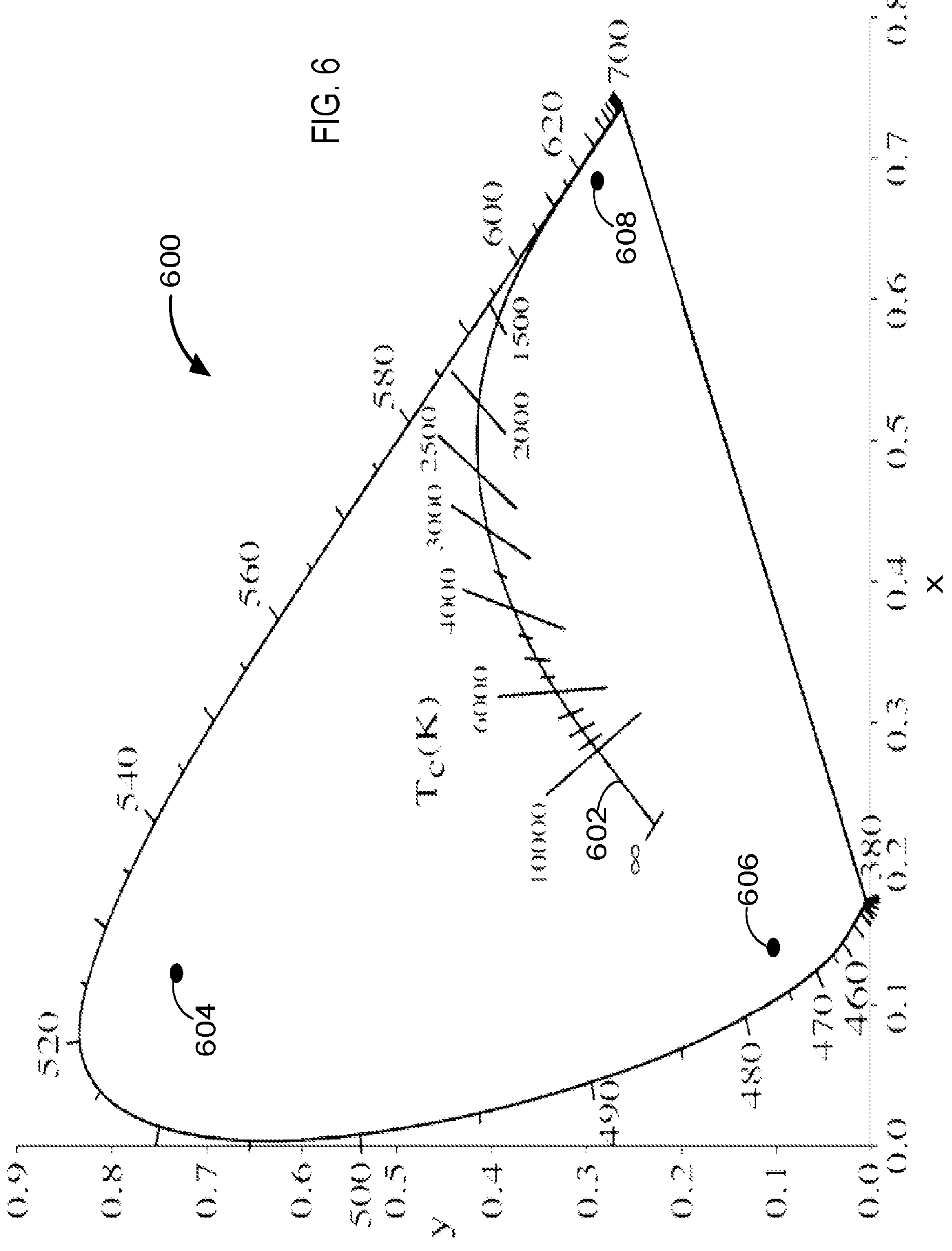
FIG. 6 shows a chromaticity diagram.

FIG. 6 shows a chromaticity diagram with approximate chromaticity coordinates of colors for typical coordinate values (as noted on the x-y scale of the chromaticity diagram 600) for a red microLED at coordinate 608, a green microLED at coordinate 606, and a blue microLED at coordinate 604. The chromaticity diagram 600 of FIG. 6 is only one way of defining a wavelength spectrum of a visible light source; other suitable definitions are known in the art and can also be used with the various embodiments of the disclosed subject matter described herein.

A convenient way to specify a portion of the chromaticity diagram 600 is through a collection of equations in the x-y plane, where each equation has a locus of solutions that defines a line on the chromaticity diagram 600. The lines may intersect to specify a particular area. The chromaticity diagram 600 also shows the BBL 602. Each of the three microLED coordinates 604, 606, 608 are the CCT coordinates for "fully-saturated" microLEDs of the respective colors green, blue, and red. However, if a "white light" is created by combining certain proportions of the R, G, and B microLEDs, the CRI of such a combination would be extremely low.

In other embodiments, rather than (or in addition to) the use of pure R, G, and B microLEDs, desaturated R, G, and B microLEDs may be used. Such desaturated R, G, and B microLEDs may be formed, e.g., by a mixture of phosphors and/or a mixture of materials to form the microLEDs and have different coordinate values from those shown in FIG. 6. In various embodiments, the desaturated R, G, and B microLEDs may have various color temperature ranges, e.g., about 1800 K to about 6500 K, about 2700 K to about 6500 K, or about 1800 K to about 7500 K.

Independent of whether pure or saturated colors are used, the x/y chromatography curve shown in FIG. 6 may be separated into a number of coordinates and the specific coordinate may be used to provide information. The number of coordinates into which the x/y chromatography curve is split may be dependent on, for example, the number and control of colors of microLEDs used as well as the resolution of the photodetectors. In some embodiments, for example, more than 1000 coordinates may be used, and in some cases greater than about 3000 coordinates. A processor may be used to individually control which microLEDs are activated, as well as the current or duty cycle used to drive the microLEDs to adjust the intensity of emission from each microLED. The coordinates within the x/y chromatography curve may be defined by a unique set of driving characteristics for microLEDs in one or more of the microLED arrays. The driving characteristics may be stored (e.g., as a table) in memory and retrieved and used by the processor.

Returning to FIG. 3, the light emitter 300 may contain a microLED array 302. The microLED array 302 may include multiple subarrays 304 arranged in a regular arrangement. Each subarray 304 may include multiple single color (center wavelength $\lambda_n$) microLEDs 306. As shown, the light emitter 300 may include m subarrays 304 each with n microLEDs 306. As shown in FIG. 3, m is 9 and n is 12, however m and n may take other values. For example, in other embodiments each subarray 304 may include red, green, and blue microLEDs 306 or red, green, blue, and yellow microLEDs 306.

In some embodiments, each subarray 304 may be independently controlled with corresponding microLEDs 306 (of substantially identical colors) being driven substantially identically across the subarrays 304. The term "substantially identical colors" as used herein may be defined as the difference between the dominant wavelengths of different emitters, whose range may have a lower boundary and an upper boundary due to the dependance on spacing between the two adjacent colors on the spectrum. A lower boundary for the dominant wavelength is the average of the dominant wavelength of the spectrum and a neighboring spectrum that has lower power. Similarly, an upper boundary for the dominant wavelength is the average of the dominant wavelength of the spectrum and a neighboring spectrum that has higher power. This may result in a difference of at most a few nm, for example. In practice, different colors may result from changing the semiconductor active region material (e.g., via process variation) or phosphors/quantum dots deposited on top of a blue emitting pixel (e.g., variation in the amount of blue light escaping without being converted).

In some embodiments, each microLED 306 within each subarray 304 may also be independently controlled. Thus, in some embodiments, each subarray 304 may act as a single emitting unit, with n subchannels defined by the microLEDs 306 that can independently modulated for data transmission (i.e., each subchannel is defined by its wavelength). The use of m subarrays 304 repeated within the light emitter 300 may permit m spatially separated channels to be used for data communications. These spatially separated channels may be transmitted through a single optical fiber, multiple optical fibers (e.g., one optical fiber for one or more subarrays 304), or free space.

The microLED arrays 302 may be disposed on a backplane that contains control circuitry as shown in FIG. 1. The microLED arrays 302 may be disposed within the light emitter 300 in a regular arrangement with equal distances between adjacent microLED arrays 302. In some embodiments, the microLEDs 306 within each of the microLED arrays 302 may be substantially identical, with microLEDs 306 in corresponding positions across the microLED arrays 302 providing substantially identical colors. In other embodiments, the microLEDs 306 within each of the microLED arrays 302 may provide substantially identical colors but at least some of the colors may be present in different positions between at least some of the microLED arrays 302.

In some embodiments, each microLED 306 within a particular subarray 304 may emit light of a different wavelength. In other embodiments, at least some of the microLEDs 306 within the particular subarray 304 may emit light of a different wavelength and at least some of the microLEDs 306 within the particular subarray 304 may emit light of substantially identical wavelengths. This latter embodiment may, for example, be used to provide a wider range of intensities for microLEDs having lower external quantum efficiencies (EQEs) (e.g., blue microLEDs have a higher EQE than red or green microLEDs).

The light emitter 300 may be fabricated via mass transfer techniques. In this case, microLEDs 306 having different emission wavelengths may be grown and processed at a wafer level. Sets of microLEDs 306 having the same wavelength may be transferred to (picked up and placed on) the backplane using one or more mass transfer placements before the transferring the next sets of microLEDs 306 having a different wavelength in a different location. The mass transfer may be used to simultaneously build up the subarrays 304 and the overall light emitter 300 in a per-wavelength manner. In other embodiments, the microLEDs 306 may be monolithically grown and processed as an array of m LEDs, or may be built from an array of multi-terminal transferrable die, The light emitter 400 in FIG. 4A contains m segmented arrays 402 each of polychromic microLEDs 404. Here, m≥1, thus the light emitter 400 may include one or more segmented arrays 402 each of polychromic microLEDs 404. Each polychromic microLED 404 may be able to emit light of multiple different colors (peak wavelength), each color being provided by a different junction of the semiconductor stack that is vertically aligned (i.e., overlap laterally) with the other junctions. Each polychromic microLED 404 and/or each color of each polychromic microLED 404 may be individually addressed. In some embodiments, the colors emitted by each polychromic microLED 404 may be substantially identical, or one or more of the colors generated by one polychromic microLED 404 may be different from the colors generated by another polychromic microLED 404.

As shown in the cross-sectional view of FIG. 4B, each polychromic microLED 404 may have n active regions 404*a*, 404*b*, 404*c*, that are separated by dielectric (current-blocking) layers 404*d*. Here, n>1, so each polychromic microLED 404 has multiple active regions 404*a*, 404*b*, 404*c*. The active regions 404*a*, 404*b*, 404*c* (which may include multiple quantum wells) may produce light of different wavelengths through the use of different materials and/or dopants. The active regions 404*a*, 404*b*, 404*c* are disposed such that shorter wavelengths are generated more proximate to the emitting (top) surface of the polychromic microLED 404 to reduce the probability of reabsorption of light by active regions 404*a*, 404*b*, 404*c* more proximate to the emitting surface than the generating active region 404*a*, 404*b*, 404*c*.

Although only three active regions 404*a*, 404*b*, 404*c* are shown, any number of active regions may be used. In some embodiments, at least some of the active regions 404*a*, 404*b*, 404*c* may generate light at substantially the same wavelength. The number of active regions 404*a*, 404*b*, 404*c* may be limited by the semiconductors used and/or processing to create the polychromic microLED 404. As above, the minimum wavelength difference between different active regions 404*a*, 404*b*, 404*c* may be limited by the sensitivity of the photoreceivers or ability to resolve descrete points within the x/y chromatography curve. In some embodiments, some of the active regions 404*a*, 404*b*, 404*c* may generate light of substantially identical peak wavelength. Contacts, which may be achieved by tunnel junctions for example, to the active regions 404*a*, 404*b*, 404*c* are not shown for convenience. Nor are reflectors or other optical elements at edges of the active regions 404*a*, 404*b*, 404*c* to increase an amount of light generated.

Thus, spectral tunability may be achieved via the presence of n individually-addressable active regions 404*a*, 404*b*, 404*c* per polychromic microLED 404 within the microLED array 402 and multi-terminal contacting. This permits each polychromic microLED 404 to be one unit that provides n channels for data transmission. In some cases, where m=1, n may be relatively large (e.g., >5), leading to a single pixel with a dense stack of active regions that emit light having different peak wavelengths (colors or near IR). In some embodiments, the processor that controls the driving of each individually-addressable active region 404*a*, 404*b*, 404*c* may use one or more non-binary data-transmission algorithms to further increase the bandwidth, which may increase efficiency gains of transmission. Such algorithms may include NR20OOK, Opposition Flow Directional Algorithm (OFDA), partition around medoids (PAM), etc.

Independent of which light emitter is used, the light emitted from a light source that has n units may be collected and transmitted by a low-dispersion optical fiber and dispersed onto a fast detector array for detection. The optical fiber may include an imaging fiber that has sufficient spatial resolution at the transmitter end to collect the light from one unit (n-channels) without crosstalk between channels. At the receiver end, the imaging optical fiber may be split such that the light from each unit is directed to a separate detector array, where the wavelengths from the unit may be individually detected.

Figure 7:
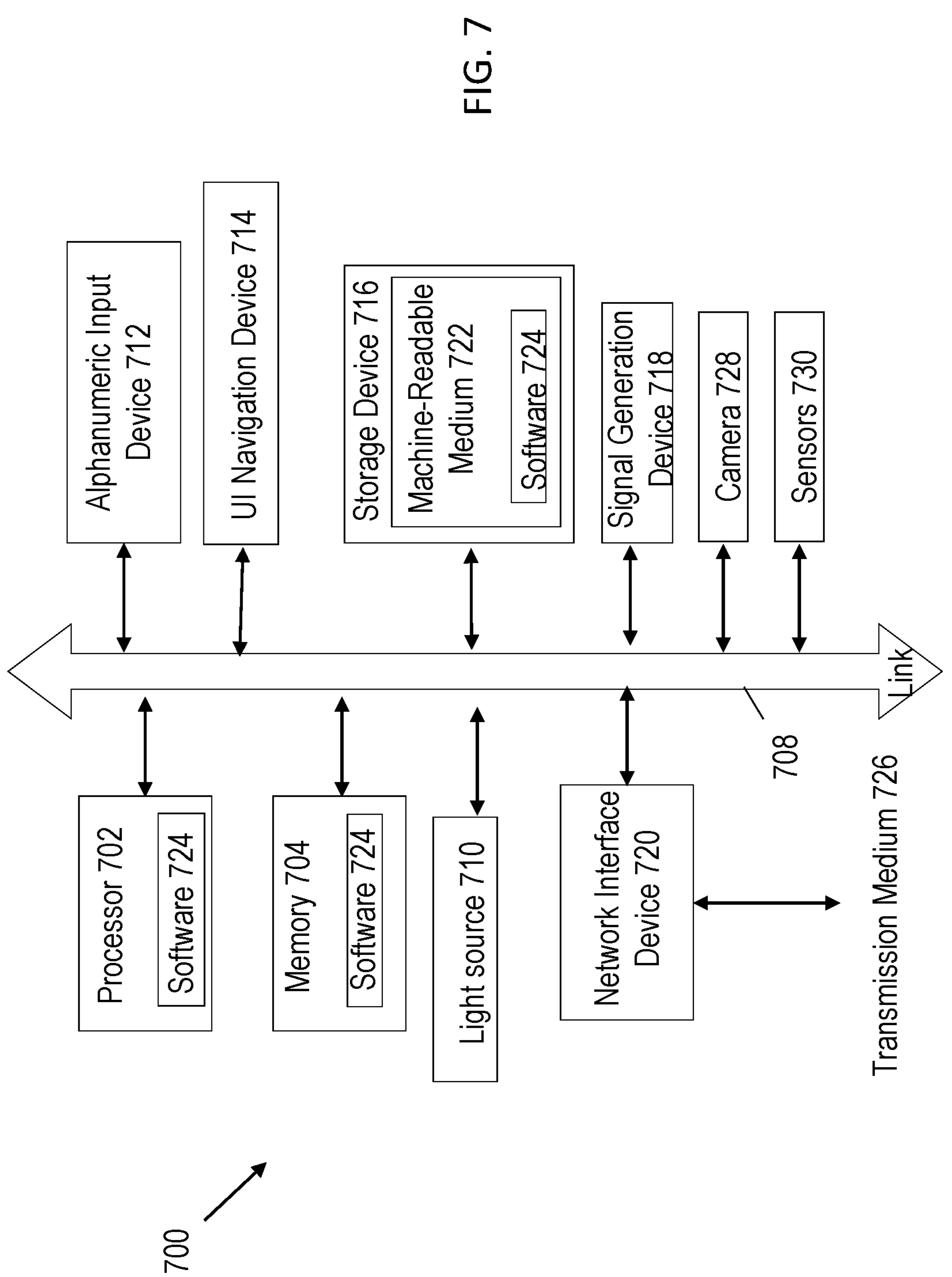
FIG. 7 illustrates an example of an electronic device in accordance with some embodiments.

FIG. 7 illustrates an example of an electronic device in accordance with some embodiments. The electronic device 700 may transmit and/or receive high speed communications as described herein. The electronic device 700 may be, for example, a display, a monitor or screen, a wearable/mobile display device such as an AR/VR headset, a vehicular headlight, lighting for a particular area, or any other lighting arrangement. Various elements may be provided on a backplane indicated above, while other elements may be local or remote.

Modules and components are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The electronic device 700 may include a hardware processor (or equivalently processing circuitry) 702 (e.g., a central processing unit (CPU), a GPU, a hardware processor core, or any combination thereof), a memory 704 (which may include main and static memory), some or all of which may communicate with each other via an interlink (e.g., bus) 708. The memory 704 may contain any or all of removable storage and non-removable storage, volatile memory or non-volatile memory. The electronic device 700 may further include a light source 710 such as the microLEDs described above, or a video display, an alphanumeric input device 712 (e.g., a keyboard), and a user interface (UI) navigation device 714 (e.g., a mouse). In an example, the light source 710, input device 712 and UI navigation device 714 may be a touch screen display. The electronic device 700 may additionally include a storage device (e.g., drive unit) 716, a signal generation device 718 (e.g., a speaker), a network interface device 720, one or more cameras 728, and one or more sensors 730, such as a global positioning system (GPS) sensor, compass, accelerometer, or other sensor such as those described herein. The electronic device 700 may further include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.). Some of the elements, such as one or more of the sparse arrays that provide the light source 710 may be remote from other elements and may be controlled by the hardware processor 702.

The storage device 716 may include a non-transitory machine readable medium 722 (hereinafter simply referred to as machine readable medium) on which is stored one or more sets of data structures or instructions 724 (e.g., software) embodying or utilized by any one or more of the techniques or functions described herein. A storage device 716 that includes the non-transitory machine readable medium should not be construed as that either the device or the machine-readable medium is itself incapable of having physical movement. The instructions 724 may also reside, completely or at least partially, within the memory 704 and/or within the hardware processor 702 during execution thereof by the electronic device 700. While the machine readable medium 722 is illustrated as a single medium, the term "machine readable medium" may include a single medium or multiple media (e.g., a centralized or distributed database, and/or associated caches and servers) configured to store the one or more instructions 724.

The term "machine readable medium" may include any medium that is capable of storing, encoding, or carrying instructions for execution by the electronic device 700 and that cause the electronic device 700 to perform any one or more of the techniques of the present disclosure, or that is capable of storing, encoding or carrying data structures used by or associated with such instructions. Non-limiting machine-readable medium examples may include solid-state memories, and optical and magnetic media. Specific examples of machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks.

The instructions 724 may further be transmitted or received over a communications network using a transmission medium 726 via the network interface device 720 utilizing any one of a number of wireless local area network (WLAN) transfer protocols or a SPI or CAN bus. Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as Institute of Electrical and Electronics Engineers (IEEE) 702.11 family of standards known as Wi-Fi, IEEE 702.14 family of standards known as WiMax, IEEE 702.14.4 family of standards, a Long Term Evolution (LTE) family of standards, a Universal Mobile Telecommunications System (UMTS) family of standards, peer-to-peer (P2P) networks, a next generation (NG)/6th generation (6G) standards among others. In an example, the network interface device 720 may include one or more physical jacks (e.g., Ethernet, coaxial, or phone jacks) or one or more antennas to connect to the transmission medium 726.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical CPU, a single- or multi-core processor, and/or any other device capable of executing or otherwise operating computer-executable instructions, such as program code, software modules, and/or functional processes.

The camera 728 may sense light at least the wavelength or wavelengths emitted by the microLEDs. The camera 728 may include optical elements (e.g., at least one camera lens) that are able to collect reflected light of illumination that is reflected from and/or emitted by an illuminated region. The camera lens may direct the reflected light onto a multi-pixel sensor (also referred to as a light sensor) to form an image of on the multi-pixel sensor.

The processor 702 may control and drive the LEDs via one or more drivers. For example, the processor 702 may optionally control one or more microLEDs in microLED arrays independent of another one or more microLEDs in the microLED arrays, so as to illuminate an area in a specified manner.

In addition, the sensors 730 may be incorporated in the camera 728 and/or the light source 710. The sensors 730 may sense visible and/or infrared light and may further sense the ambient light and/or variations/flicker in the ambient light in addition to reception of the reflected light from the LEDs. The sensors may have one or more segments (that are able to sense the same wavelength/range of wavelengths or different wavelength/range of wavelengths), similar to the LED arrays.

Figure 8:
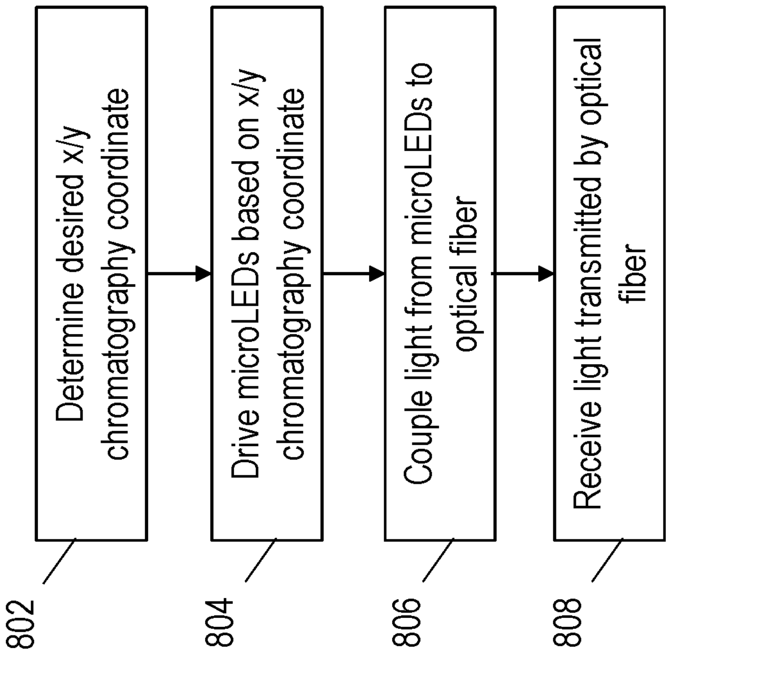
FIG. 8 show an example method of high speed communications, in accordance with some embodiments.

FIG. 8 show an example method 800 of high speed communications, in accordance with some embodiments. Other operations may be used, but are not shown for convenience. At operation 802, a processor in the light transmitting device may determine a desired x/y chromatography coordinate. In some embodiments, the x/y chromatography coordinate may be dependent on the data to be transmitted (e.g., using a non-binary algorithm). In this case, a mapping between the desired x/y chromatography coordinate and the data to be transmitted may be stored in a table in memory and retrieved by the processor when used. For example, each x/y chromatography coordinate may be defined as a different number (e.g., 0 may be deep violet and 100 may be pale red).

At operation 804, the processor may determine which microLEDs/junctions to drive based on the x/y chromatography coordinate, as well as the driving characteristics (e.g., duty cycle for PWM driving) for each microLED/junction. The processor may obtain the driving information based on a table in memory that provides a mapping between the desired x/y chromatography coordinate and driving information (based on previous calibration). The processor may then control driving of the microLEDs/junctions based thereon.

At operation 806, the light from the microLEDs/junctions may be coupled to an optical fiber for communication to a receiver. In some embodiments, the light from the light transmitting device may be transmitted into the optical fiber using one or more coupling optical elements. In other embodiments, the optical fiber may not be used, the light may be transmitted through free space (with or without the use of optical elements).

At operation 808, the light may be received (e.g., via the optical fiber) by photodetectors on the receiving device. Individual photodetectors may be tuned to receive only one of the colors transmitted by the microLEDs/junctions (e.g., using an optical bandpass filter on the photodetector) or may be broadband-sensitive to most if not all of the colors transmitted by the microLEDs/junctions. In this case, correspondence between the specific photodetector and a specific microLED may be determined through previous calibration. The transmitted data may be determined based on the x/y chromatography coordinate as determined from a processor in the receiving device and corresponding mapping as above.

Alternatively, rather than relying on the x/y chromatography coordinate, each microLED/junction may be used to provide separate bits of information. In this case, the arrays may carry duplicate information (e.g., to increase the transmission power, provide redundancy, or provide the same information to multiple disparate locations through coupling to different optical fibers or splitting of a single optical fiber into multiple optical fibers) or one or more microLEDs/junctions within one or more of the arrays may carry different information. In the last case, for example, each microLED/junction may carry a different bit of information, so that hundreds or thousands of bits of information may be carried simultaneously using different wavelengths.

EXAMPLES

Example 1 is a micro light-emitting diode (LED) system comprising: a microLED array configured to emit light of different colors, the microLED array selected from a group of microLED arrays that include: a first microLED array that contains multiple subarrays, each subarray including multiple independently-addressable single color microLEDs configured to emit light of different colors and being independently modulated for data communication to another microLED array, and a second microLED array that contains at least one independently-addressable polychromic microLED, each polychromic microLED having multiple active regions, each polychromic microLED configured to emit light selected from among multiple colors provided by the active regions and being independently modulated for data transmission to the other microLED array, which contains at least one of the first microLED array or the second microLED array.

In Example 2, the subject matter of Example 1 includes, an optical fiber configured to couple data transmission between the microLED array and the other microLED array.

In Example 3, the subject matter of Examples 1-2 includes, wherein: the microLED array includes the first microLED array, and each subarray of the first microLED array is configured to emit at least one color that is identical to at least one color emitted by at least one other subarray.

In Example 4, the subject matter of Examples 1-3 includes, wherein: the microLED array includes the first microLED array, and the subarrays of the first microLED array are configured to emit identical colors.

In Example 5, the subject matter of Example 4 includes, wherein microLEDs configured to emit identical colors across the subarrays are disposed in identical positions in each subarray.

In Example 6, the subject matter of Examples 1-5 includes, wherein: the microLED array includes the first microLED array having m subarrays that provide m spatially-separated channels for data communication, and each subarray contains n microLEDs that provide n subchannels for data communication.

In Example 7, the subject matter of Examples 1-6 includes, wherein: the microLED array includes the second microLED array, and each active region of a particular polychromic microLED is configured to emit a different color.

In Example 8, the subject matter of Examples 1-7 includes, wherein: the microLED array includes the second microLED array, and at least one active region of a particular polychromic microLED is configured to emit an identical color as another active region of the particular polychromic microLED.

In Example 9, the subject matter of Examples 1-8 includes, wherein the microLED array includes the second microLED array, each active region of each polychromic microLED is independently-addressable.

In Example 10, the subject matter of Examples 1-9 includes, a photodetector array configured to receive multi-color light from the other microLED array, the photodetector array having multiple photodetectors configured to generate current based on data received from the other microLED array, wherein each photodetector in the photodetector array includes a filter configured to filter light from the other microLED array such that the photodetector responds to only one color of the multi-color light emitted by the other microLED array.

Example 11 is a micro light-emitting diode (LED) system comprising: a backplane; a processor disposed on the backplane; at least one driver controlled by the processor; a microLED array disposed on the backplane, the microLED array having microLEDs selected from a set of microLEDs that include, single-color microLEDs in multiple subarrays and polychromic microLEDs, the microLEDs configured to be independently driven by the at least one driver to produce optical data on independent subchannels using different colors; and a photodetector array disposed on the backplane, the photodetector array configured to receive multi-color light from another microLED array having microLEDs selected from the set of microLEDs, the photodetector array containing photodetectors configured to generate current based on data received from the other microLED array.

In Example 12, the subject matter of Example 11 includes, wherein the processor is configured to: separate an x/y chromatography curve into a plurality of coordinates, map each coordinate to data and driving information, and control the at least one driver to drive the microLED array to generate the optical data based on a selected coordinate.

In Example 13, the subject matter of Examples 11-12 includes, an optical fiber configured to couple data transmission between the microLED array and the other microLED array, the optical fiber including an imaging fiber having sufficient spatial resolution to collect light emitted from multiple channels of the microLED array without crosstalk between channels.

In Example 14, the subject matter of Examples 11-13 includes, wherein: the microLED array includes multiple subarrays, each subarray includes multiple independently-addressable single color microLEDs, and each subarray is configured to emit identical colors emitted by at least one other subarray.

In Example 15, the subject matter of Example 14 includes, wherein microLEDs configured to emit identical colors across the subarrays are disposed in identical positions in each subarray.

In Example 16, the subject matter of Examples 11-15 includes, wherein: the microLED array includes polychromic microLEDs, each polychromic microLED has multiple active regions, each active region of a particular polychromic microLED is configured to emit a different color, and each active region is configured to be independently modulated.

In Example 17, the subject matter of Examples 11-16 includes, wherein: the microLED array includes polychromic microLEDs, each polychromic microLED has multiple active regions, at least one active region of a particular polychromic microLED is configured to emit an identical color as another active region of the particular polychromic microLED, and each active region is configured to be independently modulated.

In Example 18, the subject matter of Examples 11-17 includes, wherein the processor is configured to: separate an x/y chromatography curve into a plurality of coordinates, map each coordinate to particular data, and determine, based on a particular coordinate determined from colors detected by the photodetectors, the data from the other microLED array.

Example 19 is a method of transmitting optical data, the method comprising: determining optical data to transmit; map the optical data to a plurality of colors and driving information to drive microlight-emitting diode (microLEDs) to generate the plurality of colors, the microLEDs disposed in a microLED array and selected from a set of microLEDs that include, single-color microLEDs in multiple subarrays and polychromic microLEDs; independently driving the microLEDs to produce the optical data on independent subchannels using the plurality of colors; and transmitting the optical data to a photodetector array through an optical fiber coupled with the microLED array.

In Example 20, the subject matter of Example 19 includes, wherein the microLED array is selected from a group of microLED arrays that include: a first microLED array that contains multiple subarrays, each subarray including multiple independently-addressable single color microLEDs configured to emit light of different colors and being independently modulated for data communication to another microLED array, and a second microLED array that contains at least one independently-addressable polychromic microLED, each polychromic microLED having independently-addressable multiple active regions, each polychromic microLED configured to emit light selected from among multiple colors provided by the active regions.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to indicate one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. As indicated herein, although the term "a" is used herein, one or more of the associated elements may be used in different embodiments. For example, the term "a processor" configured to carry out specific operations includes both a single processor configured to carry out all of the operations as well as multiple processors individually configured to carry out some or all of the operations (which may overlap) such that the combination of processors carry out all of the operations. Further, the term "includes" may be considered to be interpreted as "includes at least" the elements that follow.

The Abstract of the Disclosure is submitted with the understanding that it will not be used to interpret or limit the scope or meaning of the claims. In addition, in the foregoing Detailed Description, it may be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A micro light-emitting diode (LED) system comprising:

a microLED array configured to emit light of different colors, the microLED array selected from a group of microLED arrays that include:

a first microLED array that contains multiple subarrays, each subarray including multiple independently-addressable single color microLEDs configured to emit light of different colors and being independently modulated for data communication to an other microLED array, and a second microLED array that contains at least one independently-addressable polychromic microLED, each polychromic microLED having multiple active regions, each polychromic microLED configured to emit light selected from among multiple colors provided by the active regions and being independently modulated for data transmission to the other microLED array, which contains at least one of the first microLED array or the second microLED array; and a photodetector array configured to receive multi-color light from the other microLED array, the photodetector array having multiple photodetectors configured to generate current based on data received from the other microLED array, each photodetector in the photodetector array including a filter configured to filter light from the other microLED array such that the photodetector responds to only one color of the multi-color light emitted by the other microLED array.

2. The microLED system of claim 1, further comprising an optical fiber configured to couple data transmission between the microLED array and the other microLED array.

3. The microLED system of claim 1, wherein:

the microLED array includes the first microLED array, and each subarray of the first microLED array is configured to emit at least one color that is substantially identical to at least one color emitted by at least one other subarray.

4. The microLED system of claim 1, wherein:

the microLED array includes the first microLED array, and the subarrays of the first microLED array are configured to emit substantially identical colors.

5. The microLED system of claim 4, wherein microLEDs configured to emit substantially identical colors across the subarrays are disposed in substantially identical positions in each subarray.

6. The microLED system of claim 1, wherein:

the microLED array includes the first microLED array having m subarrays that provide m spatially-separated channels for data communication, and each subarray contains n microLEDs that provide n subchannels for data communication.

7. The microLED system of claim 1, wherein:

the microLED array includes the second microLED array, and each active region of a particular polychromic microLED is configured to emit a different color.

8. The microLED system of claim 1, wherein:

the microLED array includes the second microLED array, and at least one active region of a particular polychromic microLED is configured to emit a substantially identical color as another active region of the particular polychromic microLED.

9. The microLED system of claim 1, wherein the microLED array includes the second microLED array, each active region of each polychromic microLED is independently-addressable.

10. A micro light-emitting diode (LED) system comprising:

a backplane;

a processor disposed on the backplane;

at least one driver controlled by the processor;

a microLED array disposed on the backplane, the microLED array having microLEDs selected from a set of microLEDs that include single-color microLEDs in multiple subarrays and polychromic microLEDs, the set of microLEDs configured to be independently driven by the at least one driver to produce optical data on independent subchannels using different colors;

a photodetector array disposed on the backplane, the photodetector array configured to receive multi-color light from an other microLED array having microLEDs selected from the set of microLEDs, the photodetector array containing photodetectors configured to generate current based on data received from the other microLED array; and an optical fiber configured to couple data transmission between the microLED array and the other microLED array, the optical fiber including an imaging fiber having sufficient spatial resolution to collect light emitted from multiple channels of the microLED array without crosstalk between channels.

11. The microLED system of claim 10, wherein the processor is configured to:

separate an x/y chromatography curve into a plurality of coordinates, map each coordinate to data and driving information, and control the at least one driver to drive the microLED array to generate the optical data based on a selected coordinate.

12. The microLED system of claim 10, wherein:

the microLED array includes multiple subarrays, each subarray includes multiple independently-addressable single color microLEDs, and each subarray is configured to emit substantially identical colors emitted by at least one other subarray.

13. The microLED system of claim 12, wherein microLEDs configured to emit substantially identical colors across the subarrays are disposed in substantially identical positions in each subarray.

14. The microLED system of claim 10, wherein:

the microLED array includes polychromic microLEDs, each polychromic microLED has multiple active regions, each active region of a particular polychromic microLED is configured to emit a different color, and each active region is configured to be independently modulated.

15. The microLED system of claim 10, wherein:

the microLED array includes polychromic microLEDs, each polychromic microLED has multiple active regions, at least one active region of a particular polychromic microLED is configured to emit a substantially identical color as another active region of the particular polychromic microLED, and each active region is configured to be independently modulated.

16. The microLED system of claim 10, wherein the processor is configured to:

separate an x/y chromatography curve into a plurality of coordinates, map each coordinate to particular data, and determine, based on a particular coordinate determined from colors detected by the photodetectors, the data from the other microLED array.

17. A method of transmitting optical data, the method comprising:

determining optical data to transmit;

mapping the optical data to a plurality of colors and driving information to drive microlight-emitting diode (microLEDs) to generate the plurality of colors, the microLEDs disposed in a microLED array and selected from a set of microLEDs that include single-color microLEDs in multiple subarrays and polychromic microLEDs;

independently driving the microLEDs to produce the optical data on independent subchannels using the plurality of colors; and transmitting the optical data to a photodetector array through an optical fiber coupled with the microLED array, the microLED array being selected from a group of microLED arrays that include:

a first microLED array that contains multiple subarrays, each subarray including multiple independently-addressable single color microLEDs configured to emit light of different colors and being independently modulated for data communication to an other microLED array, and a second microLED array that contains at least one independently-addressable polychromic microLED, each polychromic microLED having independently-addressable multiple active regions, each polychromic microLED configured to emit light selected from among multiple colors provided by the active regions.

18. The microLED system of claim 1, further comprising an imaging optical fiber configured to:

collect light emitted from the microLED array with sufficient spatial resolution to prevent crosstalk between channels at a transmitter end; and split at a receiver end such that light from each subarray or polychromic microLED is directed to a separate photodetector array.

19. The microLED system of claim 1, further comprising a processor configured to encode data for transmission by independently controlling:

a correlated color temperature (CCT) of light emitted by the microLED array, a Duv value of light emitted by the microLED array representing a distance above or below a black body locus, and a luminous flux of light emitted by the microLED array, wherein each unique combination of CCT, Duv value, and luminous flux corresponds to a distinct data value.

20. The microLED system of claim 10, further comprising a processor configured to encode data for transmission by independently controlling:

a correlated color temperature (CCT) of light emitted by the microLED array, a Duv value of light emitted by the microLED array representing a distance above or below a black body locus, and a luminous flux of light emitted by the microLED array, wherein each unique combination of CCT, Duv value, and luminous flux corresponds to a distinct data value.

* * * * *